United States Patent
Langeslag et al.

(10) Patent No.: US 10,608,541 B1
(45) Date of Patent: Mar. 31, 2020

(54) DIGITIZING THE CONTROL LOOP FOR A POWER CONVERTER BY USING A DELTA-SIGMA MODULATOR

(71) Applicant: NXP B.V., Eindhoven (NL)

(72) Inventors: Wilhelmus Hinderikus Maria Langeslag, Wijchen (NL); Joan Wichard Strijker, Wijchen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/236,288

(22) Filed: Dec. 28, 2018

(51) Int. Cl.
*H02M 3/335* (2006.01)
*H03M 3/00* (2006.01)
*H03H 17/06* (2006.01)
*H03H 17/04* (2006.01)

(52) U.S. Cl.
CPC ....... *H02M 3/33515* (2013.01); *H03M 3/456* (2013.01); *H03H 17/0411* (2013.01); *H03H 17/0614* (2013.01); *H03H 17/0671* (2013.01)

(58) Field of Classification Search
CPC .............. H02M 3/33515; H03M 3/456; H03H 17/0411; H03H 17/0671; H03H 17/0614
See application file for complete search history.

(56) References Cited

U.S. PATENT DOCUMENTS

| | | | | |
|---|---|---|---|---|
| 7,239,257 | B1* | 7/2007 | Alexander | H02M 3/157 341/138 |
| 7,589,514 | B1* | 9/2009 | Fernald | H02M 3/156 324/76.11 |
| 7,652,604 | B2 | 1/2010 | Parayandeh et al. | |
| 7,990,215 | B2 | 8/2011 | Soenen et al. | |
| 8,441,235 | B2 | 5/2013 | Shi et al. | |
| 9,621,043 | B2* | 4/2017 | Kimura | H02M 3/158 |
| 2008/0048628 | A1* | 2/2008 | Lee | H02M 3/158 323/271 |
| 2008/0192509 | A1* | 8/2008 | Dhuyvetter | H02M 3/33523 363/17 |
| 2008/0272946 | A1* | 11/2008 | Melanson | H02M 1/4225 341/143 |

* cited by examiner

*Primary Examiner* — Kyle J Moody

(57) ABSTRACT

Most of the AC-DC converters have an analog control loop, which costs additional pins for the compensator, and there are limited options to change settings when, for example, the output voltage needs to change. This specification discloses systems and methods, where a delta-sigma ADC (analog-to-digital converter) is used to digitize the input voltage. The filter after the delta-sigma ADC can give a big delay, which reduces the phase margin of the control loop. To minimize the delay, this invention ensures that, when the setpoint is reached, the input of the delta-sigma modulator is in the middle of the input range. In some embodiments, a digital control loop can be implemented using a delta-sigma modulator together with a PI controller (proportional-integrator controller).

20 Claims, 12 Drawing Sheets

1400

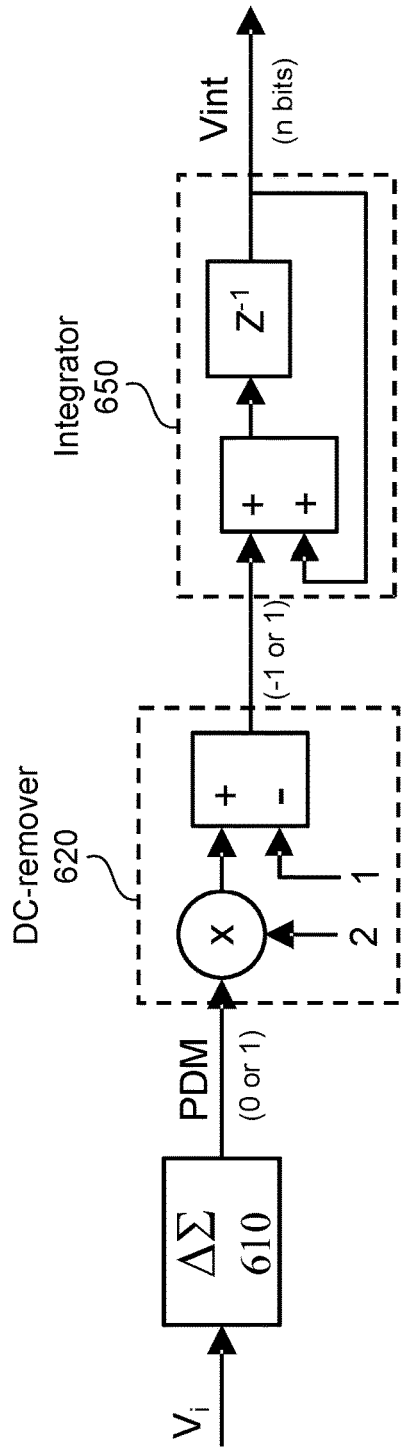
FIG. 6
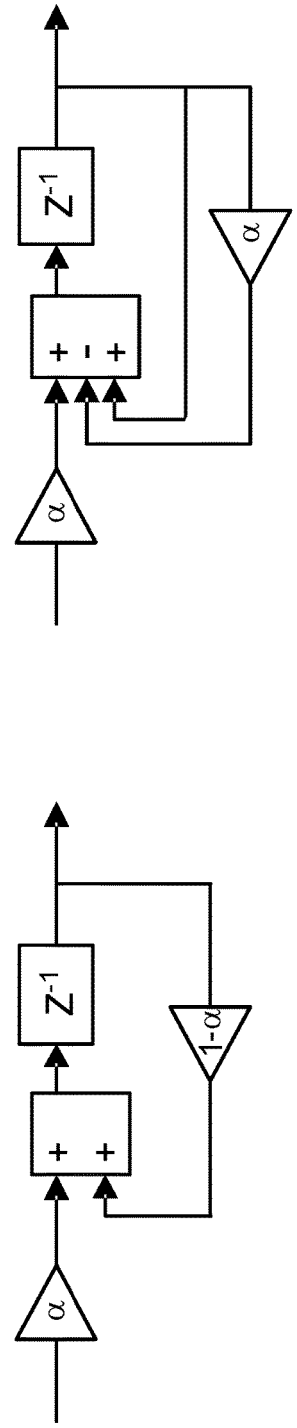
FIG. 7A
FIG. 7B

1400

US 10,608,541 B1

DIGITIZING THE CONTROL LOOP FOR A POWER CONVERTER BY USING A DELTA-SIGMA MODULATOR

FIELD

The described embodiments relate generally to systems and methods that provide for power conversion, and more particularly to systems and methods that provide for power conversion by digitizing the control loop.

BACKGROUND

Most of the power converters have an analog control loop. These power converters can include, for example, AC/DC (alternating current/direct current) power converters, and DC/DC (direct current/direct current) power converters.

In FIG. 1, an example implementation of an analog control loop for a power converter 100 is shown. The power converter 100 shown in FIG. 1 is a flyback converter, but this can be for any type of converter. The power converter 100 includes a feedback component 110. For the feedback, an opto-coupler or a communication transformer can be used. For non-isolated converters, the feedback block does not contain mains isolation and can be for example a wire.

For the implementation shown in FIG. 1, it can be seen that two amplifiers are used for controlling both the voltage and the current. In FIG. 1, the top amplifiers (associated with ISNS) is controlling the current, while the bottom amplifiers (associated with VSNS) is controlling the voltage. For the system, a setpoint for the converter can be generated based on the output of the two amplifiers.

For power converters with an analog control loop, there are costs for additional pins for the compensator, and there are limited options to change settings when, for example, the output voltage needs to change.

Because of these issues with using an analog control loop, there are strong motivations for systems and methods that provide for power conversion by digitizing the control loop.

SUMMARY

This specification discloses systems and methods that provide for power conversion by digitizing the control loop. In particular, this specification discloses systems and methods, where a delta-sigma ADC (analog-to-digital converter) is used to digitize the input voltage. The filter after the delta-sigma ADC can give a big delay, which reduces the phase margin of the control loop. To minimize the delay, this invention ensures that, when the setpoint is reached, the input of the delta-sigma modulator is in the middle of the input range. The frequency of the PDM (Pulse Density Modulator) output signal of the ADC has the highest frequency and can be filtered out easier which results in a smooth regulation. In some embodiments, a digital control loop can be implemented using a delta-sigma modulator (and a DC-remover) together with a PI controller (proportional-integrator controller).

The present invention provides for a control loop for a power converter, the control loop comprising: (a) a delta-sigma modulator, wherein an input for the delta-sigma modulator is in between a high reference level and a low reference level of the delta-sigma modulator when the power converter is in regulation; (b) a first digital filter; (c) a proportional gain unit; (d) an integrator.

In some embodiments, the input for the delta-sigma modulator is substantially at a midpoint between the high reference level and the low reference level of the delta-sigma modulator when the power converter is in regulation.

In some embodiments, an input to the control loop is one of the following parameters of the power converter: (1) a voltage, (2) a current, (3) a power, wherein an output from the control loop is a control signal to drive the power converter.

In some embodiments, the control loop further comprising (e) a DC-remover, wherein an output from the delta-sigma modulator is a PDM (pulse density modulation), wherein the PDM is further processed by the DC-remover.

In some embodiments, an average value of an output from the DC-remover is zero when the input for the delta-sigma modulator is exactly at the midpoint between the high reference level and the low reference level of the delta-sigma modulator.

In some embodiments, an output from the DC-remover is configured to be an input to the integrator.

In some embodiments, the control loop further comprising (f) an integrator gain unit and (g) a combiner unit.

In some embodiments, an output from the DC-remover is configured to be an input in parallel to both the first digital filter and the integrator, wherein an output from the first digital filter is configured to be an input to the proportional gain unit, wherein an output from the integrator is configured to be an input to the integrator gain unit, wherein outputs from both the proportional gain unit and the integrator gain unit are configured to be inputs to the combiner unit.

In some embodiments, the first digital filter comprises a low pass filter, wherein the low pass filter filters out high frequency switching noise that is similar to an analog implementation of the control loop.

In some embodiments, the control loop further comprising (h) a second digital filter, wherein an output from the second digital filter is configured to be an input to the first digital filter, wherein the output from the DC-remover is now reconfigured to be an input in parallel to both the second digital filter and the integrator.

In some embodiments, the control loop further comprising (h) a second digital filter, wherein an output from the second digital filter is configured to be an input in parallel to both the first digital filter and the integrator, wherein the output from the DC-remover is now reconfigured to be an input to the second digital filter.

In some embodiments, the first digital filter is comprising of one or more of the following: (1) an IIR (infinite impulse response) filter, (2) a FIR (finite impulse response) filter, (3) a CIC (cascaded integrator-comb) filter, (4) a decimator, wherein the decimator is configured for a lower sampling frequency, (5) a different type of digital filter, wherein the second digital filter is comprising of one or more of the following: (1) an IIR (infinite impulse response) filter, (2) a FIR (finite impulse response) filter, (3) a CIC (cascaded integrator-comb) filter, (4) a decimator, wherein the decimator is configured for a lower sampling frequency, (5) a different type of digital filter.

In some embodiments, an output from the DC-remover is configured to be an input to the first digital filter, wherein an output from the first digital filter is configured to be an input in parallel to both the proportional gain unit and the integrator, wherein an output from the integrator is configured to be an input to the integrator gain unit, wherein outputs from both the proportional gain unit and the integrator gain unit are configured to be inputs to the combiner unit.

In some embodiments, the control loop further comprising (h) a second digital filter, wherein an output from the second digital filter is configured to be an input to the first digital filter, wherein the output from the DC-remover is now reconfigured to be an input to the second digital filter.

In some embodiments, the first digital filter is comprising of one or more of the following: (1) an IIR (infinite impulse response) filter, (2) a FIR (finite impulse response) filter, (3) a CIC (cascaded integrator-comb) filter, (4) a decimator, wherein the decimator is configured for a lower sampling frequency, (5) a different type of digital filter.

In some embodiments, the second digital filter is comprising of one or more of the following: (1) an IIR (infinite impulse response) filter, (2) a FIR (finite impulse response) filter, (3) a CIC (cascaded integrator-comb) filter, (4) a decimator, wherein the decimator is configured for a lower sampling frequency, (5) a different type of digital filter.

In some embodiments, the control loop further comprising (i) an amplifier, wherein an output from the amplifier is configured to be an input to the delta-sigma modulator.

The present invention provides for a method for providing a control loop for a power converter, the method comprising: (a) performing a delta-sigma modulation, wherein an input for the delta-sigma modulation is in between a high reference level and a low reference level of the delta-sigma modulation when the power converter is in regulation; (b) performing a first digital filtering; (c) performing a proportional gain; (d) performing an integration.

The present invention provides for a computer program product comprising executable instructions encoded in a non-transitory computer readable medium which, when executed by a system comprising the power converter, carry out or control a method for providing a control loop for a power converter, the method comprising: (a) performing a delta-sigma modulation, wherein an input for the delta-sigma modulation is in between a high reference level and a low reference level of the delta-sigma modulation when the power converter is in regulation; (b) performing a first digital filtering; (c) performing a proportional gain; (d) performing an integration.

The above summary is not intended to represent every example embodiment within the scope of the current or future Claim sets. Additional example embodiments are discussed within the Figures and Detailed Description below. Other aspects and advantages of embodiments of the present invention will become apparent from the following detailed description taken in conjunction with the accompanying drawings.

BRIEF DESCRIPTION OF THE DRAWINGS

FIG. 6 shows a delta-sigma modulator (and a DC-remover) with an integrator, in accordance with some embodiments of the invention.

FIG. 7A shows a first implementation of a first order IIR (infinite impulse response) filter, in accordance with some embodiments of the invention.

FIG. 7B shows a second implementation of a first order IIR (infinite impulse response) filter, in accordance with some embodiments of the invention.

DETAILED DESCRIPTION

Figure 1:
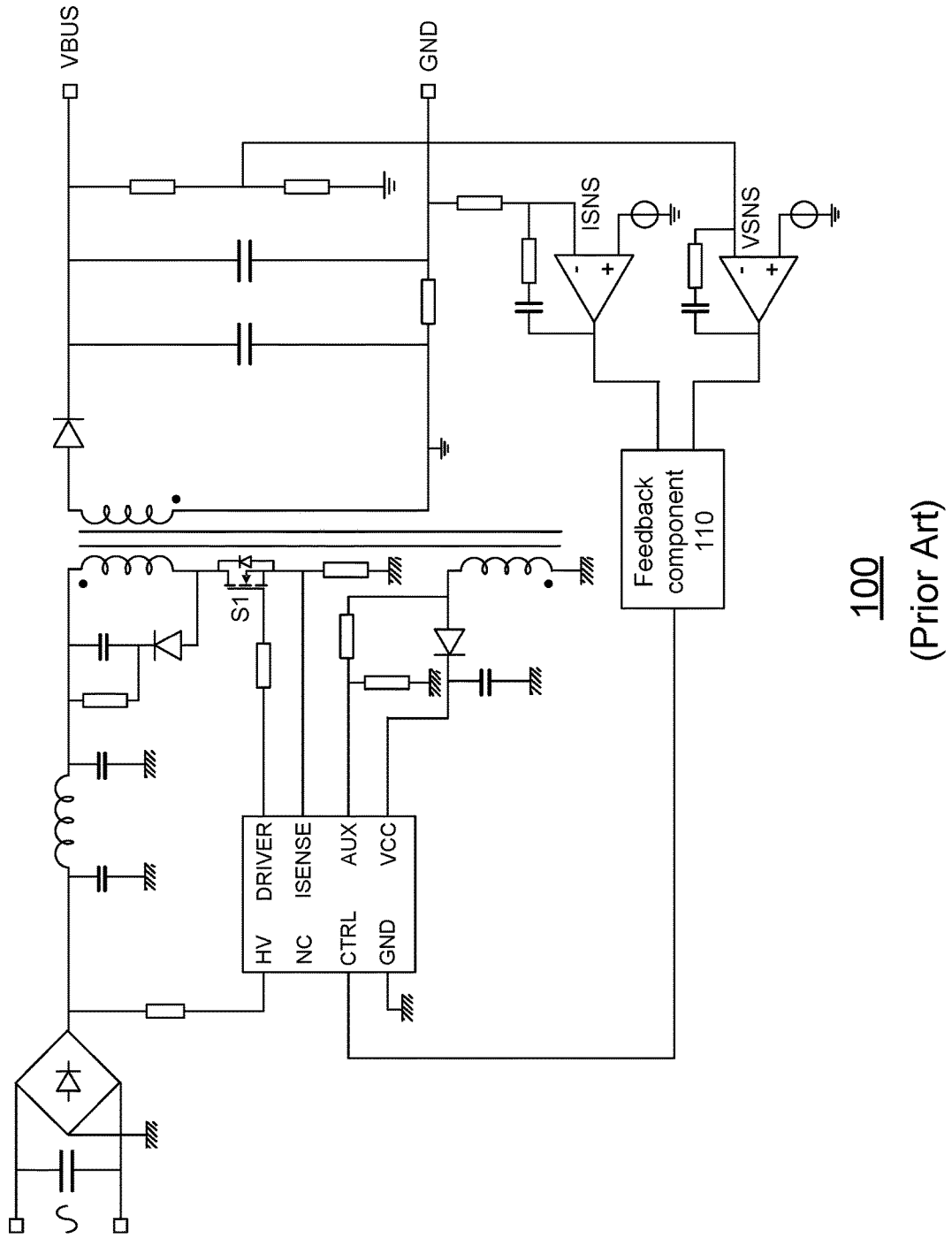
FIG. 1 shows an implementation of an analog control loop for a power converter.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

As previously described, most of the power converters have an analog control loop, which costs additional pins for the compensator and there are limited options to change settings when for example the output voltage needs to change. In other words, using an analog control loop will result in additional external components and additional pins on the package. Additionally, there is also almost no flexibility to change the control loop parameters (e.g., Proportional gain, Integrating factor, etc.).

Furthermore, there is a trend to high current charging. Therefore, in most situations, there is a requirement for a CC-mode (Current Control), meaning that 2 control loops need to be set. This costs additional components and additional pins on the IC (integrated circuit) package. Thus, there are 3 main reasons to replace an analog control loop with a digital control loop:

1. By using a digital control loop instead of an analog control loop, the IC packages can get smaller, and the number of pins can be reduced.
2. By using a digital control loop instead of an analog control loop, there is less need for external components.
3. By using a digital control loop instead of an analog control loop, it is possible to optimize the control characteristics based on settings of the system.

Implementing a digital loop will solve the problems discussed. There are multiple solutions possible for implementing a digital loop, and each solution has its own advantages and drawbacks.

A first digital loop solution uses a window (or multiple windows) to determine the output voltage, and, when the voltage is outside the window, the control takes action. An advantage of this method is the simplicity of the control circuit. A disadvantage of this method is that, for adapters/chargers, the ripple is much larger than the required accuracy of the output voltage. For example, a 5V output voltage needs to have an accuracy of 1 to 2%, while the ripple is allowed to be 100 mVpp. So, every cycle the voltage will go outside the window. Making the window larger will result in larger ripples, because the system will always cycle within the window in some conditions.

A second digital loop solution uses a flash ADC or Successive approximation ADC to sample voltage. This method is only effective when the sample frequency is much higher than the switching frequency of the converter, but this results in high current consumption. A way to overcome this is when the sample moment is synchronized with the switching cycle of the converter. This method works well with a fixed frequency system, but, when one wants to implement frequency reduction or burst mode to keep the efficiency high at low power, additional sample moments are required, which makes the implementation complex. Having a sample frequency close to the switching frequency (not synchronized) makes the control properties bad, because of the ripple of the output voltage. The output voltage ripple is caused by the switching of the switched mode power supply (SMPS).

A third digital loop solution uses a delta-sigma modulator. The invention disclosed by this specification is basically following this solution, by also using a delta-sigma modulator.

A delta-sigma ADC is a 1-bit AD (analog-to-digital) converter that runs at a much higher frequency than the switching frequency of the SNIPS. The main advantage of this type of AD converter is that regulation to a setpoint is accurate, because the delta-sigma modulator has an integrating input which ensures that the DC level is not lost. The sample frequency can be very high, so it does not have to be synchronized with the switching frequency of the SMPS. So, this method works fine when the SMPS is in frequency reduction mode and burst mode.

A disadvantage of measuring the output voltage with the delta-sigma modulator is that, when the output voltage is measured, low frequency components are generated which need to be filtered out to get a stable control signal. This filtering adds a delay, which lowers the phase margin of the regulation loop.

The invention disclosed by this specification has overcome this disadvantage of "the filtering adding a delay" by ensuring that, when the setpoint is reached, the input of the delta-sigma modulator is in the middle of the input range. By meeting this condition, the invention is able to minimize the delay (due to filtering).

Figure 2:
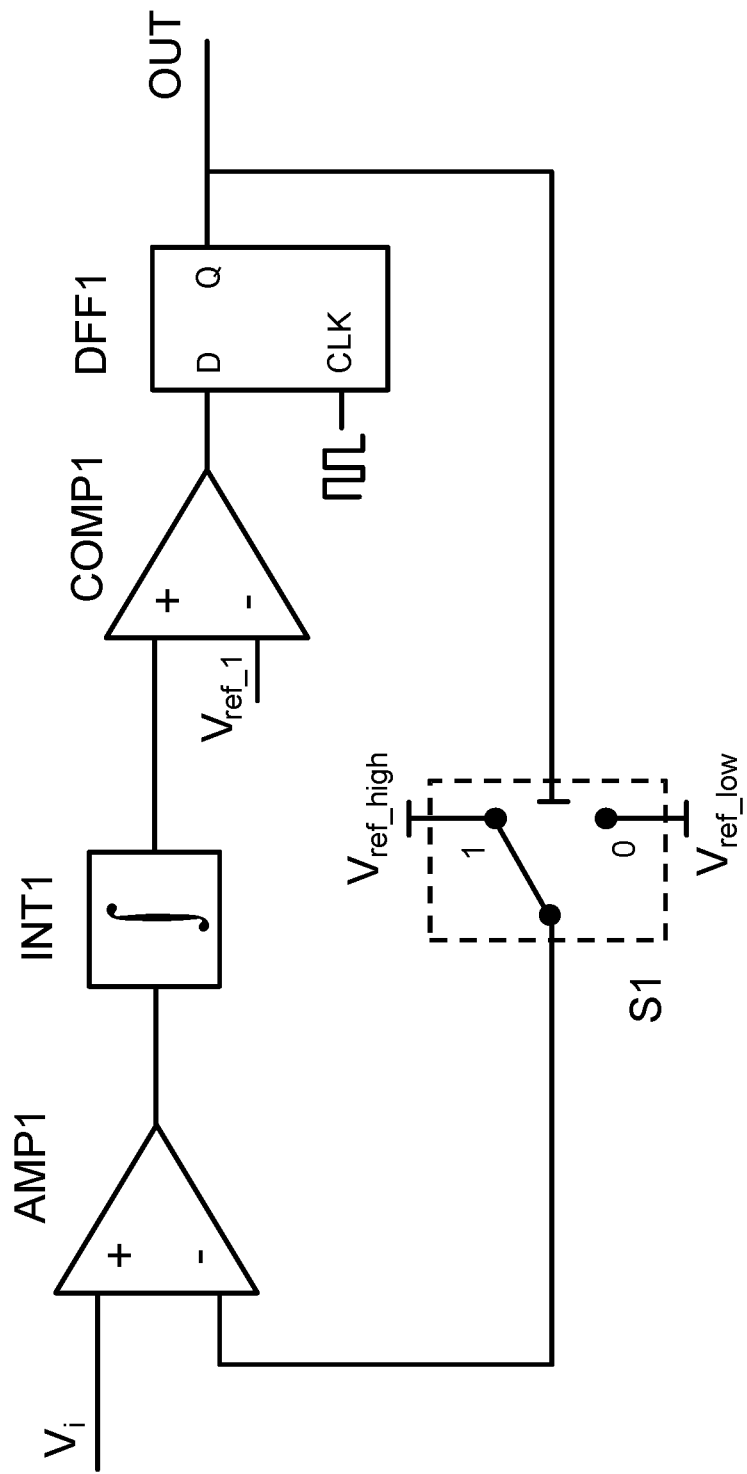
FIG. 2 shows a basic implementation of a delta-sigma modulator, in accordance with some embodiments of the invention.

As described in the previous paragraphs, the invention disclosed by this specification uses a delta-sigma modulator to digitize the control loop. In FIG. 2, the basic schematic of a delta-sigma modulator (200) is shown.

At the input, there is a differential amplifier, AMP1, followed by an integrator, INT1. The output of the integrator is compared to a reference level (Vref 1) by comparator COMP 1. The output of the comparator is sampled with frequency of the clock by D-flipflop, DFF1. When output of the D-flipflop (OUT) is high, the minus input of the differential amplifier is switched to Vref_high level by switch 51. When output of the D-flipflop (OUT) is low, the minus input of the differential amplifier is switched to Vref_low level.

Figure 3:
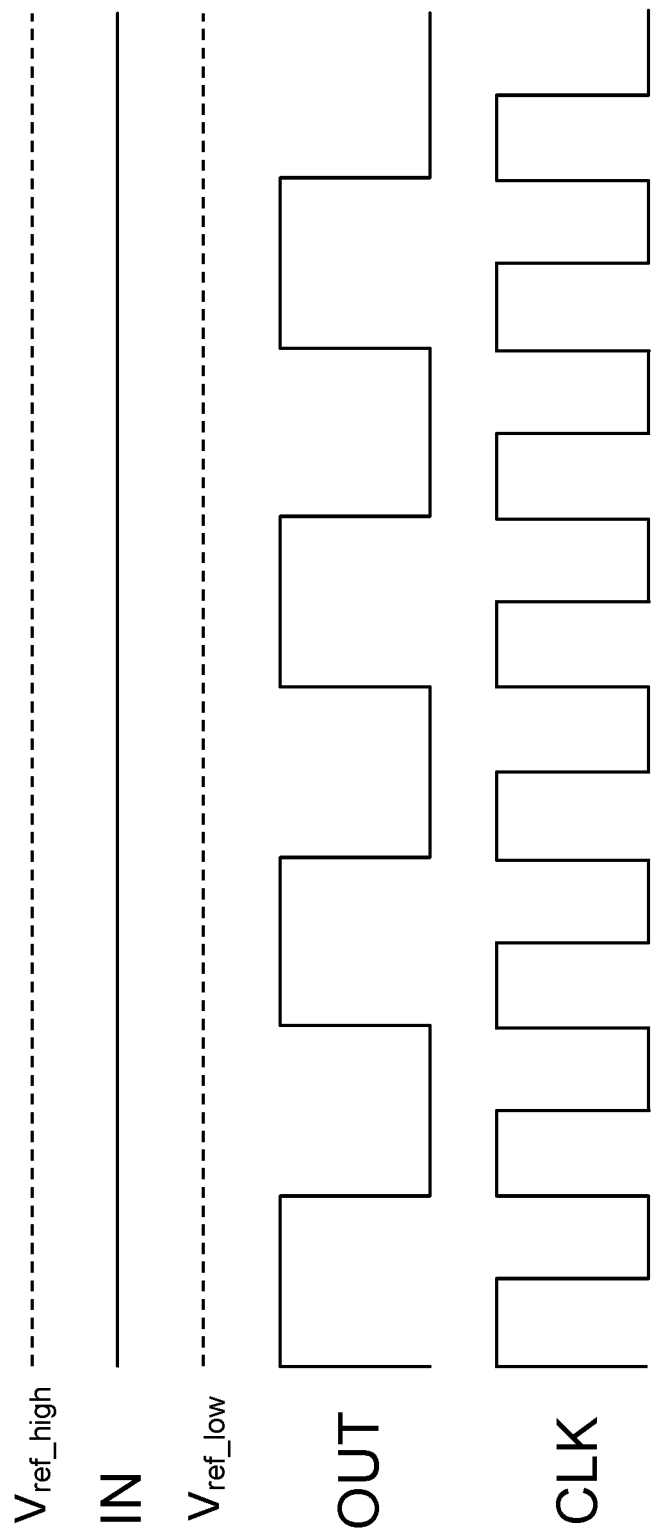
FIG. 3 shows signals of a delta-sigma modulator when an input is exactly in the middle of the window between a high reference level and a low reference level of the delta-sigma modulator, in accordance with some embodiments of the invention.

Digitizing a DC (direct current) signal with delta-sigma modulator will result in a sequence of 0 and 1's. In FIG. 3, the output signal (OUT) and clock signal (CLK) are given when the input voltage (IN) is exactly in the middle between Vref_high and Vref_low (i.e., Vi=(Vref_high+Vref_low)/2). Notice that, for the output signal (OUT), the ratio of 1's to 0's is 1 to 1 (which is equal to 50% versus 50%).

Figure 4:
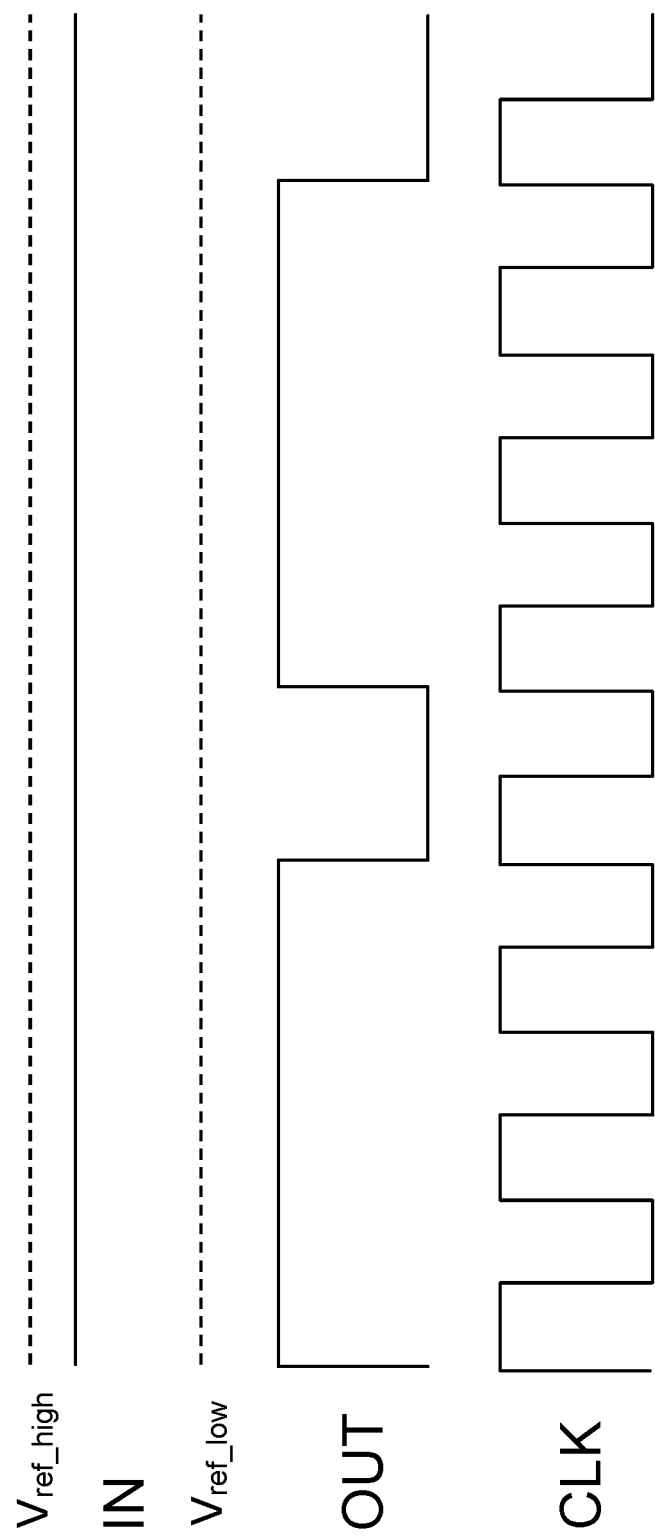
FIG. 4 shows signals of a delta-sigma modulator when an input is exactly at 75% of the window between a high reference level and a low reference level of the delta-sigma modulator, in accordance with some embodiments of the invention.

In FIG. 4, the output signal (OUT) and clock signal (CLK) are given when the input voltage is exactly at 75% between Vref_high and Vref_low (i.e., Vi=¾*Vref_high+¼*Vref_low). Notice that, for the output signal (OUT), the ratio of 1's to 0's is 3 to 1 (which is equal to 75% versus 25%).

Figure 5:
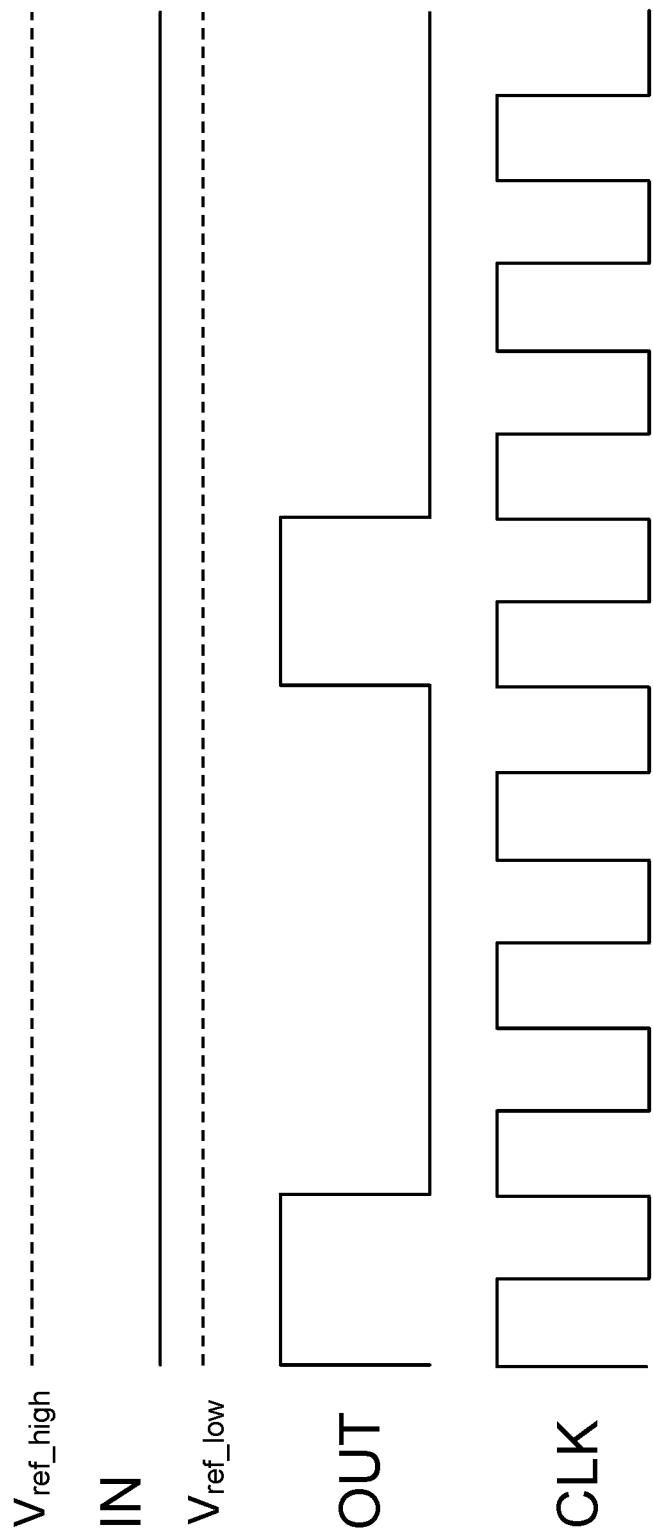
FIG. 5 shows signals of a delta-sigma modulator when an input is exactly at 25% of the window between a high reference level and a low reference level of the delta-sigma modulator, in accordance with some embodiments of the invention.

In FIG. 5, the output signal (OUT) and clock signal (CLK) are given when the input voltage is exactly at 25% between Vref_high and Vref_low (i.e., Vi=¼*Vref_high+¾*Vref_low). Notice that, for the output signal (OUT), the ratio of 1's to 0's is 1 to 3 (which is equal to 25% versus 75%).

Based on FIGS. 3-5, one can see that when the input (IN) is in the middle between Vref_high and Vref_low (i.e., FIG. 3, where Vi=(Vref_high+Vref_low)/2), the output has the highest frequency which can be filtered out more easily. This will also result in the minimum delay for the control loop.

Therefore, in this invention, a method will be described, which ensures that the system is exactly in the middle of the range when the control loop is stabilized. In this method, an efficient solution can be found where the output frequency of the delta-sigma modulator can be maximized.

In some embodiments, the present invention provides for a control loop for a power converter that can be comprising: (a) a delta-sigma modulator, wherein an input for the delta-sigma modulator is in between a high reference level and a low reference level of the delta-sigma modulator when the power converter is in regulation.

In some embodiments, the input for the delta-sigma modulator can be substantially at a midpoint between the high reference level and the low reference level of the delta-sigma modulator when the power converter is in regulation. In some embodiments, the input for the delta-sigma modulator can be exactly at a midpoint between the high reference level and the low reference level of the delta-sigma modulator when the power converter is in regulation. In some embodiments, the input for the delta-sigma modulator can be close to or near a midpoint between the high reference level and the low reference level of the delta-sigma modulator when the power converter is in regulation.

FIG. 6 shows a delta-sigma modulator (and a DC-remover) with an integrator, in accordance with some embodiments of the invention. In FIG. 6, the delta-sigma modulator (ΔΣ) is labeled as element 610. The DC-remover is labeled as element 620. The integrator is labeled as element 650.

In most control loops, an integrator is used to make the offset error equal to 0. When an integrator is placed after the delta-sigma modulator, one can be sure that the input will finally be in the middle between Vref_high and Vref_low, because at the output of the delta-sigma modulator the number of ones should be equal to the number of zeros. Otherwise the integrator output will rise or fall.

In some embodiments, the integrator can simply be an up/down counter, as shown in FIG. 6.

For most power converters, adding only an integrator as compensation to the network results in unstable loop behavior. Therefore, a proportional part is needed, and the PDM (pulse density modulation) stream should be translated to a number which can be multiplied with a proportional factor. For example, phase margin of the control loop is not allowed to have a large delay because it reduces the phase margin of the control loop.

In some embodiments, a control loop for a power converter can be comprising: (a) a delta-sigma modulator, wherein an input for the delta-sigma modulator is in between a high reference level and a low reference level of the delta-sigma modulator when the power converter is in regulation; (d) an integrator.

However, for most power converters, adding only an integrator as compensation to the network results in unstable loop behavior. Therefore, a proportional part is needed. Accordingly, in some embodiments, a control loop for a power converter can be comprising: (a) a delta-sigma modulator, wherein an input for the delta-sigma modulator is in between a high reference level and a low reference level of the delta-sigma modulator when the power converter is in regulation; (b) a first digital filter; (c) a proportional gain unit; (d) an integrator.

In some embodiments, an input to the control loop is one of the following parameters of the power converter: (1) a voltage, (2) a current, (3) a power, wherein an output from the control loop is a control signal to drive the power converter.

In some embodiments, the control loop is further comprising (e) a DC-remover, wherein an output from the delta-sigma modulator is a PDM (pulse density modulation), wherein the PDM is further processed by the DC-remover.

In some embodiments, an average value of an output from the DC-remover is zero when the input for the delta-sigma modulator is exactly at the midpoint between the high reference level and the low reference level of the delta-sigma modulator.

In some embodiments, an output from the DC-remover is configured to be an input to the integrator.

FIG. 7A shows a first implementation (or a first embodiment) of a first order IIR (infinite impulse response) filter, in accordance with some embodiments of the invention.

FIG. 7B shows a second implementation (or a second embodiment) of a first order IIR (infinite impulse response) filter, in accordance with some embodiments of the invention.

When the filter (such as the first digital filter) is a first order IIR (infinite impulse response) filter, the behavior of the phase and gain can be equal to an analog implementation and will not add additional delay.

In some embodiments, the first digital filter can be comprising of one of the following: (1) an IIR (infinite impulse response) filter, (2) a FIR (finite impulse response) filter, (3) a CIC (cascaded integrator-comb) filter, (4) a decimator, wherein the decimator is configured for a lower sampling frequency, (5) a different type of digital filter (that is not an IIR filter, a FIR filter, a CIC filter, or a decimator). When the first digital filter is acting as a decimator, then the circuits behind this filter can be at a lower rate. With a lower rate, the calculation speed can be relaxed.

In some embodiments, the first digital filter can be comprising of a non-decimator filter and a decimator filter that reduces the update frequency of the circuits behind the decimator.

Therefore, in general, for some embodiments, the first digital filter can be comprising of one or more of the following: (1) an IIR (infinite impulse response) filter, (2) a FIR (finite impulse response) filter, (3) a CIC (cascaded integrator-comb) filter, (4) a decimator, wherein the decimator is configured for a lower sampling frequency, (5) a different type of digital filter (that is not an IIR filter, a FIR filter, a CIC filter, or a decimator).

Figure 8:
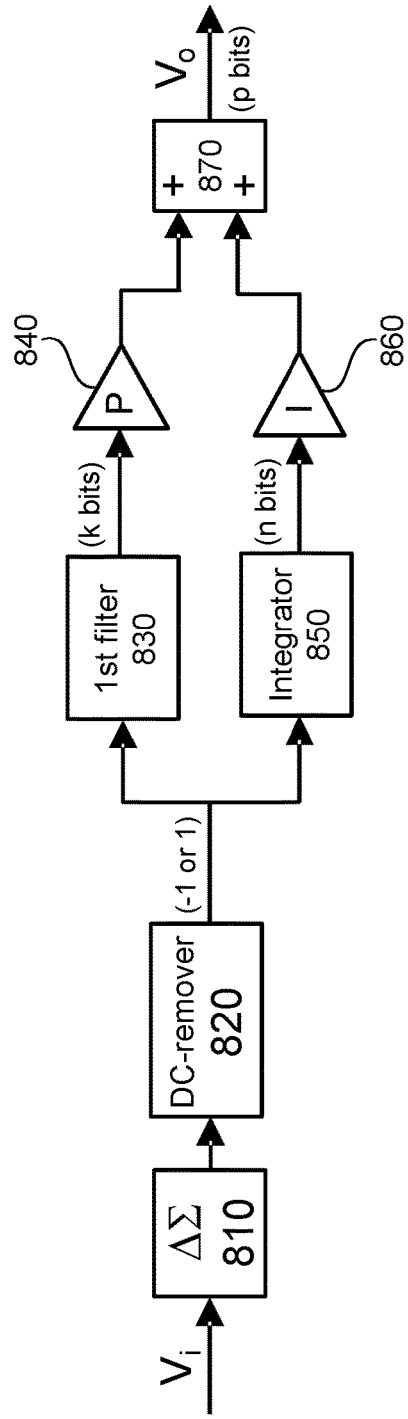
FIG. 8 shows a basic implementation of a delta-sigma modulator (and a DC-remover) with a PI controller (proportional-integrator controller), in accordance with some embodiments of the invention.

FIG. 8 shows a basic implementation of a delta-sigma modulator (and a DC-remover) with a PI controller (proportional-integrator controller), in accordance with some embodiments of the invention. Furthermore, FIG. 8 shows a basic implementation of a digital control loop (with a PI controller) that has the same behavior as an analog control loop.

For FIG. 8, in some embodiments, a control loop for a power converter can be comprising: (a) a delta-sigma modulator (ΔΣ) 810, wherein an input for the delta-sigma modulator is in between a high reference level and a low reference level of the delta-sigma modulator when the power converter is in regulation; (b) a first digital filter 830; (c) a proportional gain unit 840; (d) an integrator 850; (e) a DC-remover 820; (f) an integrator gain unit 860; and (g) a combiner unit 870.

For FIG. 8, in some embodiments, an output from the delta-sigma modulator (ΔΣ) 810 is a PDM (pulse density modulation), wherein the PDM is further processed by the DC-remover 820, wherein an output from the DC-remover is configured to be an input in parallel to both the first digital filter 830 and the integrator 850, wherein an output from the first digital filter 830 is configured to be an input to the proportional gain unit 840, wherein an output from the integrator 850 is configured to be an input to the integrator gain unit 860, wherein outputs from both the proportional gain unit 840 and the integrator gain unit 860 are configured to be inputs to the combiner unit 870.

Some pre-filtering before the IIR-filter can make the signal at the output of the IIR-filter less noisy. This filter can be FIR filter or an IIR filter. The cut-off frequency is much higher, such that the transfer function is determined by the IIR filter.

Figure 9:
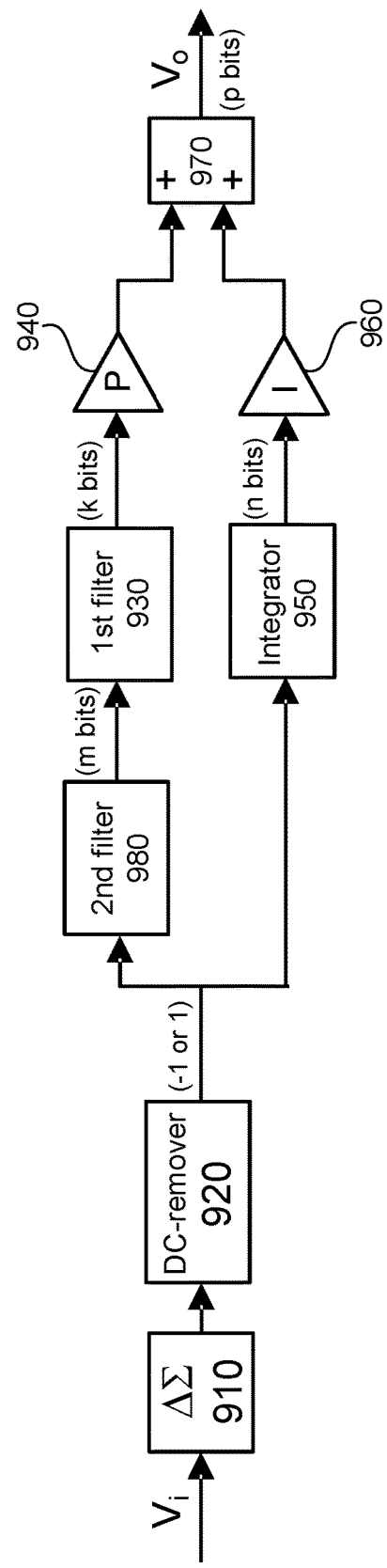
FIG. 9 shows a first embodiment of some pre-filtering (e.g., second filter) added to a basic implementation of a delta-sigma modulator (and a DC-remover) with a PI controller (proportional-integrator controller), in accordance with some embodiments of the invention.

FIG. 9 shows a first embodiment of some pre-filtering (e.g., second filter) added to a basic implementation of a delta-sigma modulator (and a DC-remover) with a PI controller (proportional-integrator controller), in accordance with some embodiments of the invention.

In FIG. 9, if no decimators are used, then all filters can still be running at the same frequency as the delta-sigma modulator. Add a filter plus a decimator (e.g., a CIC-filter, which is an optimized class of FIR filter combined with an interpolator or decimator), then the update frequency of the IIR filter can be lowered. In case the filtering coefficients, P and I are not implemented by shifting, lowering the update frequency can help by lowering the current consumption. For example, when the P and I actions require multiplications or divisions. These actions can consume significant current. A simple digital multiplier (or divider) that only multiplies (or divides) by factors of 2, can be made by just shifting the digital value. This does not (or hardly) requires additional supply current. Therefore, there is a need to lower current consumption.

For FIG. 9, a preferred embodiment can be an IIR filter for the first digital filter and a FIR filter plus a decimator for the second digital filter. However, for FIG. 9, in general, the second digital filter can have the same choices for the filter topology as the first digital filter. Furthermore, both the first and second digital filter can have decimation (i.e., a decimator for a lower sampling frequency). With a lower sampling frequency, the calculation speed can be relaxed.

Therefore, in some embodiments, the second digital filter can be comprising of one of the following: (1) an IIR (infinite impulse response) filter, (2) a FIR (finite impulse response) filter, (3) a CIC (cascaded integrator-comb) filter, (4) a decimator, wherein the decimator is configured for a lower sampling frequency, (5) a different type of digital filter (that is not an IIR filter, a FIR filter, a CIC filter, or a decimator). When the second digital filter is acting as a decimator, then the circuits behind this filter can be at a lower rate.

In some embodiments, the second digital filter can be comprising of a non-decimator filter and a decimator filter that reduces the update frequency of the circuits behind the decimator.

Therefore, in general, for some embodiments, the second digital filter can be comprising of one or more of the following: (1) an IIR (infinite impulse response) filter, (2) a FIR (finite impulse response) filter, (3) a CIC (cascaded integrator-comb) filter, (4) a decimator, wherein the decimator is configured for a lower sampling frequency, (5) a different type of digital filter (that is not an IIR filter, a FIR filter, a CIC filter, or a decimator).

For FIG. 9, in some embodiments, a control loop for a power converter can be comprising: (a) a delta-sigma modulator ($\Delta\Sigma$) 910, wherein an input for the delta-sigma modulator is in between a high reference level and a low reference level of the delta-sigma modulator when the power converter is in regulation; (b) a first digital filter 930; (c) a proportional gain unit 940; (d) an integrator 950; (e) a DC-remover 920; (f) an integrator gain unit 960; (g) a combiner unit 970; and (h) a second digital filter (980).

For FIG. 9, in some embodiments, the control loop further comprising (h) a second digital filter (980), wherein an output from the second digital filter (980) is configured to be an input to the first digital filter (930), wherein the output from the DC-remover (920) is now reconfigured to be an input in parallel to both the second digital filter (980) and the integrator (950).

Figure 10:
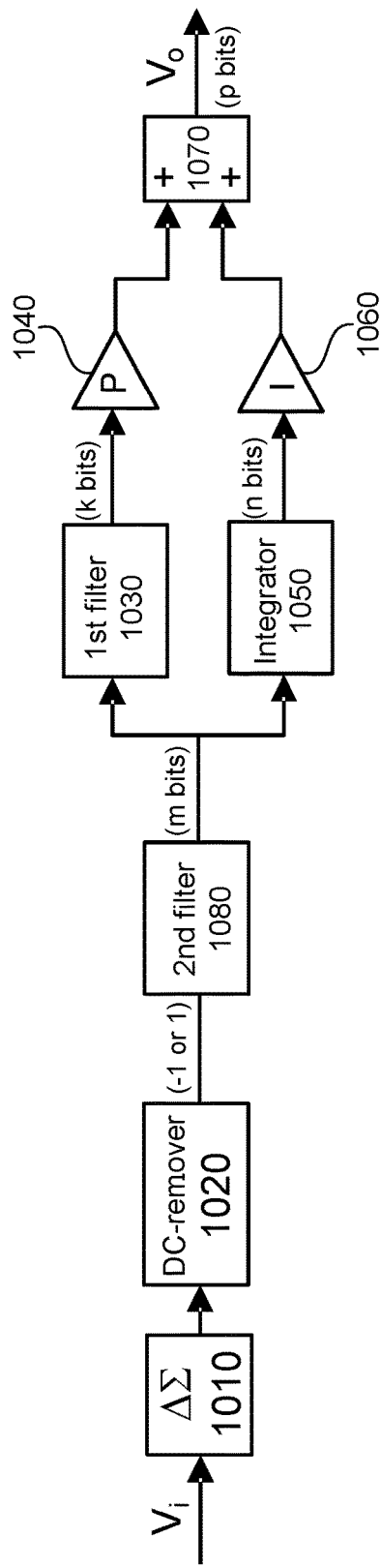
FIG. 10 shows a second embodiment of some pre-filtering (e.g., second filter) added to a basic implementation of a delta-sigma modulator (and a DC-remover) with a PI controller (proportional-integrator controller), in accordance with some embodiments of the invention.

FIG. 10 shows a second embodiment of some pre-filtering (e.g., second filter) added to a basic implementation of a delta-sigma modulator (and a DC-remover) with a PI controller (proportional-integrator controller), in accordance with some embodiments of the invention.

In FIG. 10, the second filter (which includes a decimator) is placed such that, besides the first digital filter, the integrator can also run at a lower frequency. Therefore, in FIG. 10, the added second filter (which includes a decimator) can reduce the update frequency of both the first digital filter and the integrator.

For FIG. 10, in some embodiments, a control loop for a power converter can be comprising: (a) a delta-sigma modulator ($\Delta\Sigma$) 1010, wherein an input for the delta-sigma modulator is in between a high reference level and a low reference level of the delta-sigma modulator when the power converter is in regulation; (b) a first digital filter 1030; (c) a proportional gain unit 1040; (d) an integrator 1050; (e) a DC-remover 1020; (f) an integrator gain unit 1060; (g) a combiner unit 1070; and (h) a second digital filter (1080).

For FIG. 10, in some embodiments, the control loop further comprising (h) a second digital filter (1080), wherein an output from the second digital filter (1080) is configured to be an input in parallel to both the first digital filter (1030) and the integrator (1050), wherein the output from the DC-remover (1020) is now reconfigured to be an input to the second digital filter (1080).

Figure 11:
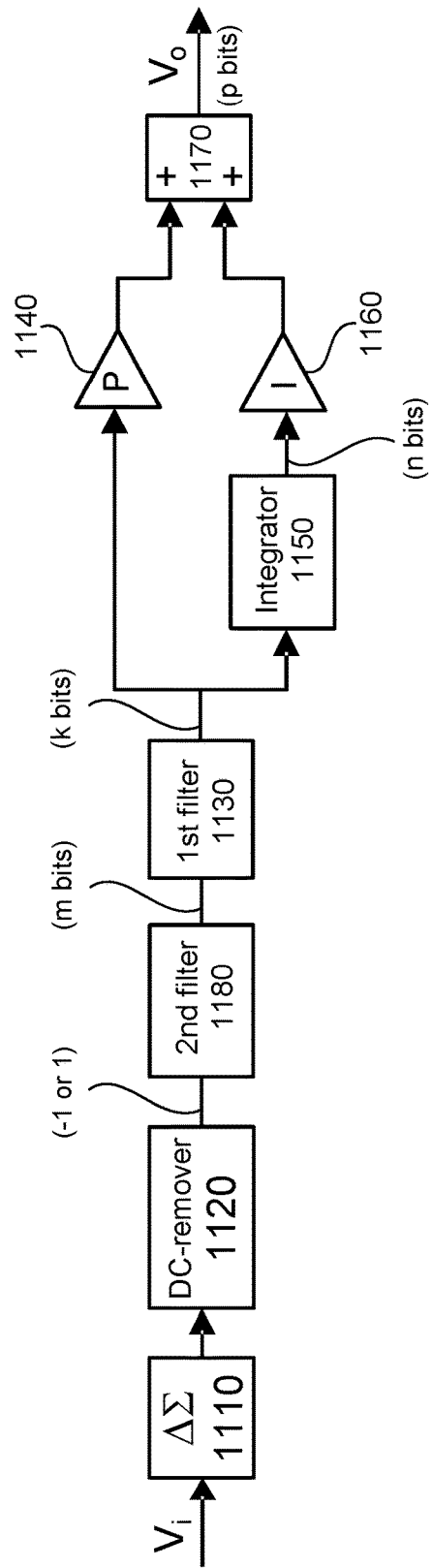
FIG. 11 shows a third embodiment of some pre-filtering (e.g., second filter) added to a basic implementation of a delta-sigma modulator (and a DC-remover) with a PI controller (proportional-integrator controller), in accordance with some embodiments of the invention.

FIG. 11 shows a third embodiment of some pre-filtering (e.g., second filter) added to a basic implementation of a delta-sigma modulator (and a DC-remover) with a PI controller (proportional-integrator controller), in accordance with some embodiments of the invention.

In FIG. 11, the first digital filter is also placed in front of the integrator. This does not affect the behavior of the control loop.

For FIG. 11, in some embodiments, a control loop for a power converter can be comprising: (a) a delta-sigma modulator ($\Delta\Sigma$) 1110, wherein an input for the delta-sigma modulator is in between a high reference level and a low reference level of the delta-sigma modulator when the power converter is in regulation; (b) a first digital filter 1130; (c) a proportional gain unit 1140; (d) an integrator 1150; (e) a DC-remover 1120; (f) an integrator gain unit 1160; (g) a combiner unit 1170; and (h) a second digital filter (1180).

For FIG. 11, in some embodiments, an output from the DC-remover (1120) is configured to be an input to the second digital filter (1180), wherein an output from the second digital filter (1180) is configured to be an input to the first digital filter (1130), wherein an output from the first digital filter (1130) is configured to be an input in parallel to both the proportional gain unit (1140) and the integrator (1150), wherein an output from the integrator (1150) is configured to be an input to the integrator gain unit (1160), wherein outputs from both the proportional gain unit (1140) and the integrator gain unit (1160) are configured to be inputs to the combiner unit (1170).

Figure 12:
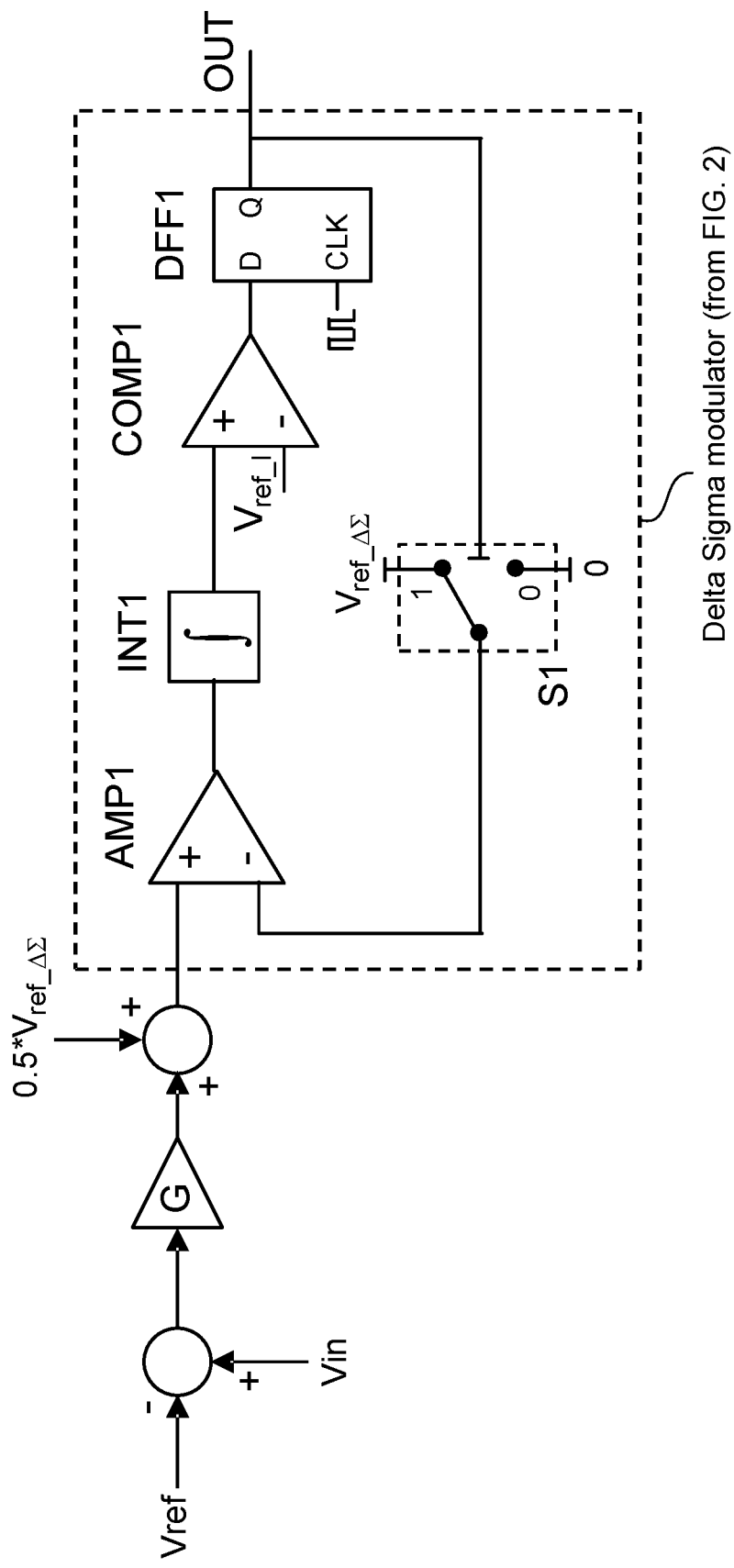
FIG. 12 shows adding an amplifier in front of a basic implementation of a delta-sigma modulator to relax an accuracy requirement, in accordance with some embodiments of the invention.

FIG. 12 shows adding an amplifier in front of a basic implementation of a delta-sigma modulator to relax an accuracy requirement, in accordance with some embodiments of the invention.

When the implementations (or embodiments) of FIGS. 8-11 (or other possible systems) are put into a closed loop system, the setpoint is exactly in the middle between Vref_high and Vref_low. The accuracy requirements of these levels are very high in the target application, so one of the improvements to relax the accuracy requirement is to add a differential amplifier (with filtering if needed) in front of the delta-sigma modulator, as shown in FIG. 12.

When the voltage Vin is equal to Vref, the output of a differential amplifier is exactly at half the reference voltage of delta-sigma modulator. With the 'G', the gain of the amplifier can be set.

In the case of FIG. 12 the setpoint of the control loop is set by Vref. The voltage (Vref_ΔΣ) of the delta-sigma is less important, because half this voltage is added as offset to the output of the amplifier. The input of the block of FIG. 12 is Vin and Vref.

In the case of FIG. 2, the setpoint of the control loop can be set by Vref_high and Vref_low. The regulation level is exactly in the middle. Therefore, when we define Vref_high=Vref+ΔV and Vref_low=Vref−ΔV, the input of the block of FIG. 2, Vi, is equal to (Vref_high+Vref_low)/2=(Vref+ΔV+Vref−ΔV)/2=Vref.

Figure 13:
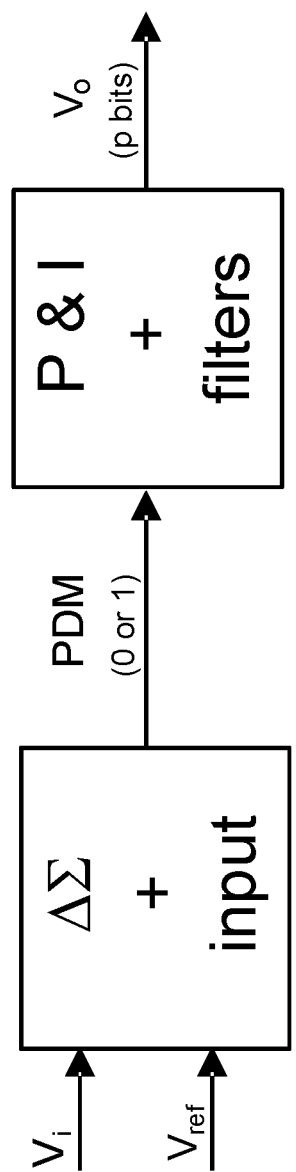
FIG. 13 shows a simplified schematic for all possible implementations of a delta-sigma modulator with a PI controller (proportional-integrator controller), in accordance with some embodiments of the invention.

Some example implementations (or embodiments) of a delta-sigma modulator with a PI controller (proportional-integrator controller) are shown in FIGS. 8-11. Other implementations (or embodiments) of a delta-sigma modulator with a PI controller are also possible, but these are not shown or specifically described in this specification. For all possible implementations (or embodiments) of a delta-sigma modulator with a PI controller, they can be depicted as a simplified schematic shown in FIG. 13. In other words, FIG. 13 shows a simplified schematic for all possible implementations of a delta-sigma modulator with a PI controller (proportional-integrator controller), in accordance with some embodiments of the invention.

Figure 14:
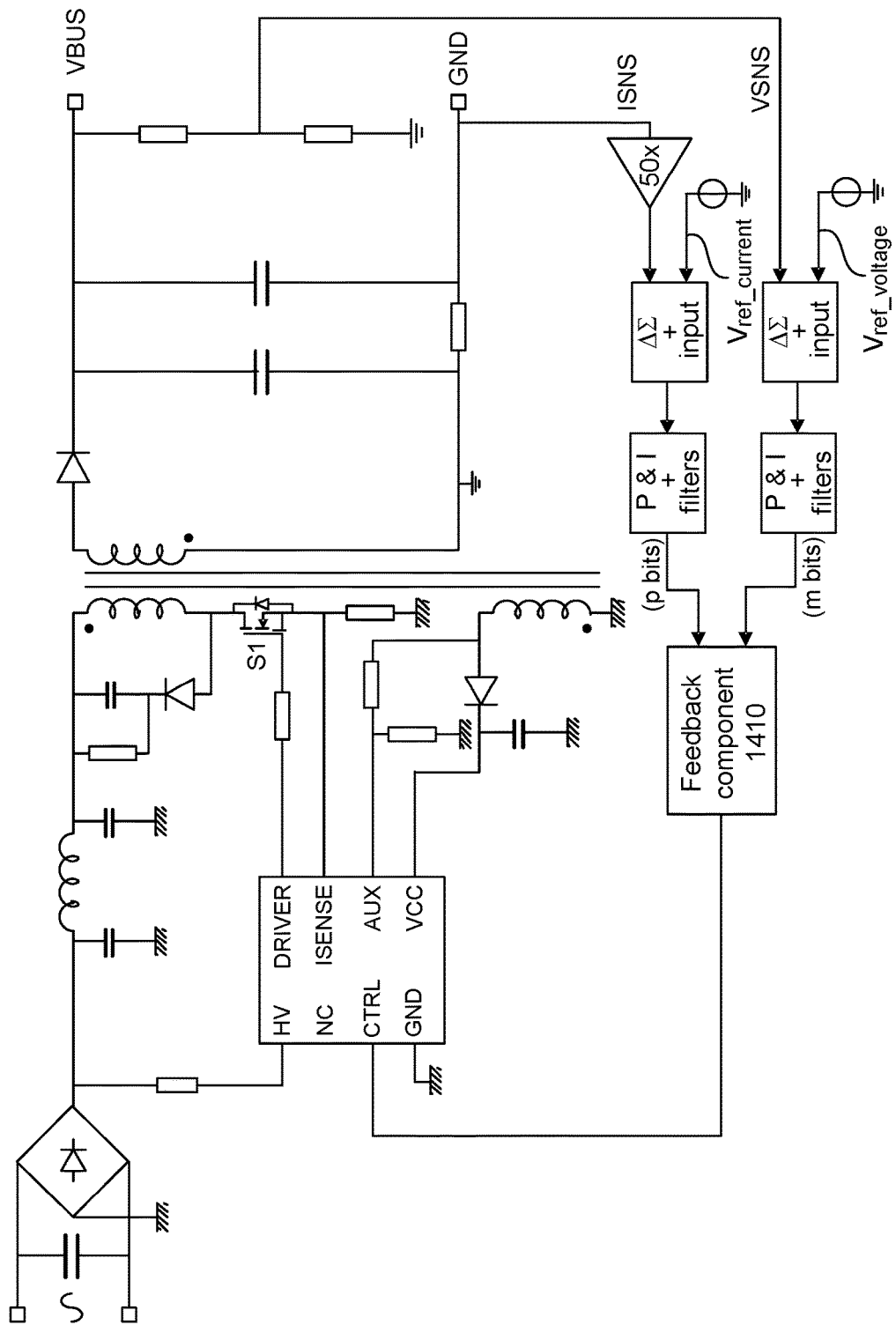
FIG. 14 shows an implementation of a digital control loop for a power converter, in accordance with some embodiments of the invention.

FIG. 14 shows an implementation of a digital control loop for a power converter 1400, in accordance with some embodiments of the invention. In FIG. 14, the total application is given with the concept integrated. Note that the digital control loop is shown as the simplified schematic of FIG. 13. In FIG. 14, both a voltage loop (associated with VSNS) and a current loop (associated with ISNS) are shown. In the feedback component 1410, the input of the voltage loop and the current loop are now digital numbers. From these numbers, a setpoint for the controller can be generated.

Figure 15:
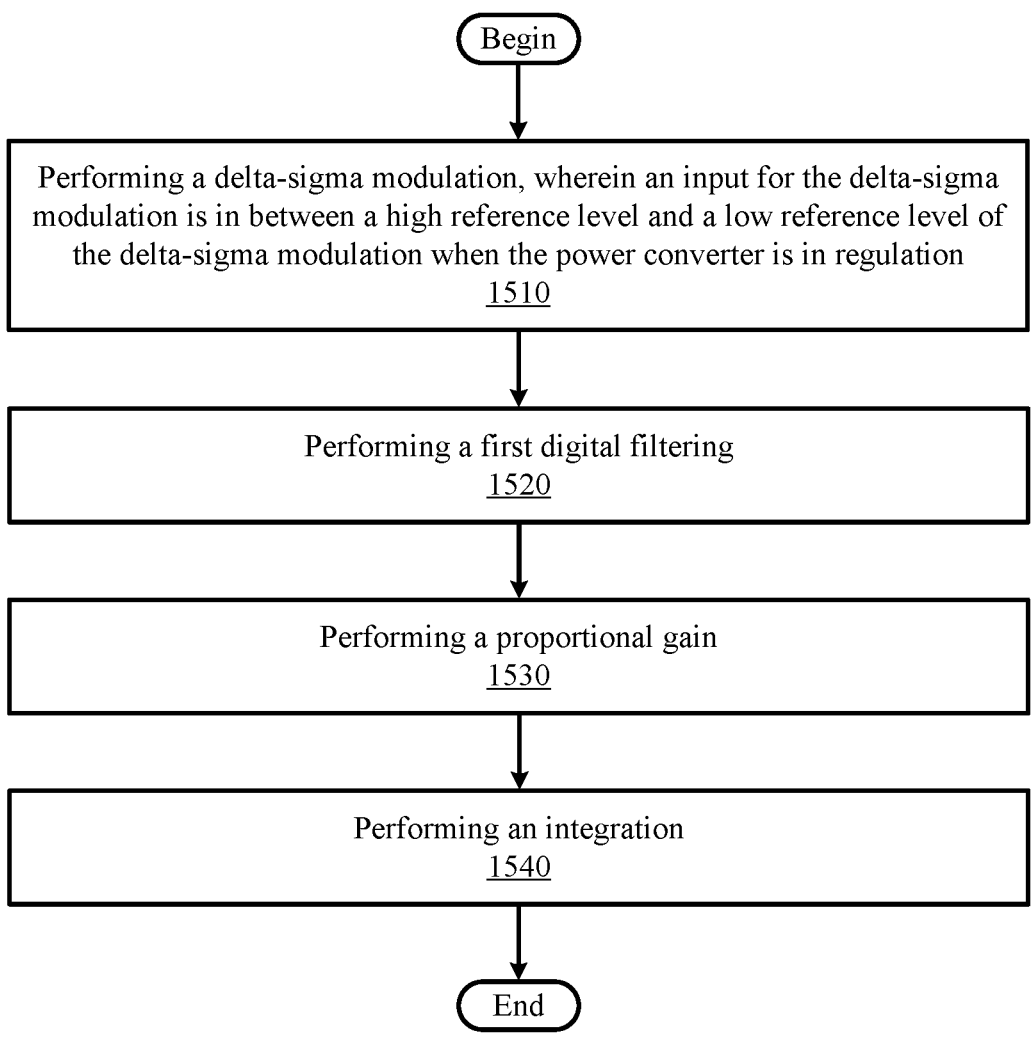
FIG. 15 shows a process flow diagram of a method for providing a digital control loop for a power converter, in accordance with some embodiments of the invention.

FIG. 15 shows a process flow diagram of a method for providing a digital control loop for a power converter, in accordance with some embodiments of the invention. As shown in FIG. 15, the method 1500 begins at step 1510, where the method performs a delta-sigma modulation, wherein an input for the delta-sigma modulation is in between a high reference level and a low reference level of the delta-sigma modulation when the power converter is in regulation. Then, the method proceeds to step 1520. In step 1520, the method performs a first digital filtering. Next, at step 1530, the method performs a proportional gain. Finally, at step 1540, the method performs an integration.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

The computer-useable or computer-readable medium can be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random access memory (RAM), a read-only memory (ROM), a rigid magnetic disc, and an optical disc. Examples of optical discs include a compact disc with read only memory (CD-ROM), a compact disc with read/write (CD-R/W), a digital video disc (DVD), and a Blu-ray disc.

The various aspects, embodiments, implementations or features of the described embodiments can be used separately or in any combination. Various aspects of the described embodiments can be implemented by software, hardware or a combination of hardware and software.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A control loop for a power converter, the control loop comprising:
   a delta-sigma modulator, wherein an input for the delta-sigma modulator is in between a high reference level and a low reference level of the delta-sigma modulator when the power converter is in regulation;
   a first digital filter;
   a proportional gain unit;
   an integrator;
   a DC-remover, wherein an output from the delta-sigma modulator is a PDM (pulse density modulation), wherein the PDM is further processed by the DC-remover;
   wherein an average value of an output from the DC-remover is zero when the input for the delta-sigma modulator is exactly at the midpoint between the high reference level and the low reference level of the delta-sigma modulator.

2. The control loop of claim 1, wherein the input for the delta-sigma modulator is substantially at a midpoint between the high reference level and the low reference level of the delta-sigma modulator when the power converter is in regulation.

3. The control loop of claim 1,
wherein an input to the control loop is one of the following parameters of the power converter:
a voltage,
a current,
a power,
wherein an output from the control loop is a control signal to drive the power converter.

4. The control loop of claim 1 further comprising a DC-remover, wherein an output from the delta-sigma modulator is a PDM (pulse density modulation), wherein the PDM is further processed by the DC-remover.

5. The control loop of claim 4, wherein an output from the DC-remover is configured to be an input to the integrator.

6. The control loop of claim 4 further comprising an integrator gain unit and a combiner unit.

7. The control loop of claim 1 further comprising an amplifier, wherein an output from the amplifier is configured to be an input to the delta-sigma modulator.

8. A control loop for a power converter, the control loop comprising:
a delta-sigma modulator, wherein an input for the delta-sigma modulator is in between a high reference level and a low reference level of the delta-sigma modulator when the power converter is in regulation;
a first digital filter;
a proportional gain unit;
an integrator;
a DC-remover, wherein an output from the delta-sigma modulator is a PDM (pulse density modulation), wherein the PDM is further processed by the DC-remover;
an integrator gain unit and a combiner unit;
wherein an output from the DC-remover is configured to be an input in parallel to both the first digital filter and the integrator, wherein an output from the first digital filter is configured to be an input to the proportional gain unit, wherein an output from the integrator is configured to be an input to the integrator gain unit, wherein outputs from both the proportional gain unit and the integrator gain unit are configured to be inputs to the combiner unit.

9. The control loop of claim 8, wherein an average value of an output from the DC-remover is zero when the input for the delta-sigma modulator is exactly at the midpoint between the high reference level and the low reference level of the delta-sigma modulator.

10. The control loop of claim 8, wherein the first digital filter comprises a low pass filter, wherein the low pass filter filters out high frequency switching noise that is similar to an analog implementation of the control loop.

11. The control loop of claim 8 further comprising a second digital filter, wherein an output from the second digital filter is configured to be an input to the first digital filter, wherein the output from the DC-remover is now reconfigured to be an input in parallel to both the second digital filter and the integrator.

12. The control loop of claim 11,
wherein the first digital filter is comprising of one or more of the following:
an IIR (infinite impulse response) filter,
a FIR (finite impulse response) filter,
a CIC (cascaded integrator-comb) filter,
a decimator, wherein the decimator is configured for a lower sampling frequency,
a different type of digital filter,
wherein the second digital filter is comprising of one or more of the following:
an IIR (infinite impulse response) filter,
a FIR (finite impulse response) filter,
a CIC (cascaded integrator-comb) filter,
a decimator, wherein the decimator is configured for a lower sampling frequency,
a different type of digital filter.

13. The control loop of claim 8 further comprising a second digital filter, wherein an output from the second digital filter is configured to be an input in parallel to both the first digital filter and the integrator, wherein the output from the DC-remover is now reconfigured to be an input to the second digital filter.

14. The control loop of claim 13,
wherein the first digital filter is comprising of one or more of the following:
an IIR (infinite impulse response) filter,
a FIR (finite impulse response) filter,
a CIC (cascaded integrator-comb) filter,
a decimator, wherein the decimator is configured for a lower sampling frequency,
a different type of digital filter,
wherein the second digital filter is comprising of one or more of the following:
an IIR (infinite impulse response) filter,
a FIR (finite impulse response) filter,
a CIC (cascaded integrator-comb) filter,
a decimator, wherein the decimator is configured for a lower sampling frequency,
a different type of digital filter.

15. A control loop for a power converter, the control loop comprising:
a delta-sigma modulator, wherein an input for the delta-sigma modulator is in between a high reference level and a low reference level of the delta-sigma modulator when the power converter is in regulation;
a first digital filter;
a proportional gain unit;
an integrator;
a DC-remover, wherein an output from the delta-sigma modulator is a PDM (pulse density modulation), wherein the PDM is further processed by the DC-remover;
an integrator gain unit and a combiner unit;
wherein an output from the DC-remover is configured to be an input to the first digital filter, wherein an output from the first digital filter is configured to be an input in parallel to both the proportional gain unit and the integrator, wherein an output from the integrator is configured to be an input to the integrator gain unit, wherein outputs from both the proportional gain unit and the integrator gain unit are configured to be inputs to the combiner unit.

16. The control loop of claim 15 further comprising a second digital filter, wherein an output from the second digital filter is configured to be an input to the first digital filter, wherein the output from the DC-remover is now reconfigured to be an input to the second digital filter.

17. The control loop of claim 16, wherein the first digital filter is comprising of one or more of the following:
- an IIR (infinite impulse response) filter,
- a FIR (finite impulse response) filter,
- a CIC (cascaded integrator-comb) filter,
- a decimator, wherein the decimator is configured for a lower sampling frequency,
- a different type of digital filter.

18. The control loop of claim 16, wherein the second digital filter is comprising of one or more of the following:
- an IIR (infinite impulse response) filter,
- a FIR (finite impulse response) filter,
- a CIC (cascaded integrator-comb) filter,
- a decimator, wherein the decimator is configured for a lower sampling frequency,
- a different type of digital filter.

19. A method for providing a control loop for a power converter, the method comprising:
- performing a delta-sigma modulation, wherein an input for the delta-sigma modulation is in between a high reference level and a low reference level of the delta-sigma modulation when the power converter is in regulation;
- performing a first digital filtering;
- performing a proportional gain;
- performing an integration;
- wherein an output from the delta-sigma modulator is a PDM (pulse density modulation), wherein the PDM is further processed by a DC-remover, wherein an average value of an output from the DC-remover is zero when the input for the delta-sigma modulator is exactly at the midpoint between the high reference level and the low reference level of the delta-sigma modulator.

20. A computer program product comprising executable instructions encoded in a non-transitory computer readable medium which, when executed by a system comprising the power converter, carry out or control the method of claim 19.

* * * * *